United States Patent [19]

Dupont et al.

[11] Patent Number: 5,555,121
[45] Date of Patent: Sep. 10, 1996

[54] PROCESS FOR SIMULTANEOUS OPTICAL MODULATION TRANSPOSITION ON SEVERAL WAVELENGTHS

[75] Inventors: Hervé Dupont; Mouhamad Chawki, both of Lannion; Georges Claveau, Camlez, all of France

[73] Assignee: France Telecom Establissment autonome de droit public, Paris, France

[21] Appl. No.: 528,661

[22] Filed: Sep. 15, 1995

Related U.S. Application Data

[63] Continuation of Ser. No. 299,666, Sep. 2, 1994, abandoned.

[30] Foreign Application Priority Data

Sep. 9, 1993 [FR] France ................................. 93 10738

[51] Int. Cl.⁶ ..................... H04B 10/04; H01S 3/098; H01S 3/10
[52] U.S. Cl. .................. 359/180; 359/181; 359/182; 372/18; 372/19; 372/26
[58] Field of Search ........................ 372/18, 28, 19, 372/26, 32, 8, 50, 96, 20, 44; 359/180, 181, 182, 189

[56] References Cited

U.S. PATENT DOCUMENTS

| | | | |
|---|---|---|---|
| 4,635,246 | 1/1987 | Taylor et al. | 359/191 |
| 4,686,485 | 8/1987 | Goldberg et al. | 372/18 |
| 4,747,107 | 5/1988 | Miller | 372/50 |
| 4,751,705 | 6/1988 | Hadley et al. | 372/50 |
| 4,977,561 | 12/1990 | Ibe et al. | 372/28 |
| 5,243,608 | 9/1993 | Chawki et al. | 372/8 |
| 5,307,366 | 4/1994 | Auffret et al. | 372/96 |

OTHER PUBLICATIONS

Electronics Letters, vol. 25, No. 20, Sep. 28, 1989, K. Inque, et al., "Wavelength Conversion for FM Light Injection Induced Frequency Shift In DFB-LD", pp. 1360–1362.

Journal of Optical Communications, vol. 12, No. 2, 1991, PH. Doare, "Optical Phase Modulation Behaviour of an Injection–Locked Semiconductor Laser for an Optical Transmission System", pp. 64–68.

Electronics Letters, vol. 24, No. 17, Aug. 18, 1988, G. Grosskopf, et al., "140 Mbit/s DPSK Transmission Using an All–Optical Frequency Converter With a 4000 GHz Conversion Range", pp. 1106–1107.

IEEE Photonics Technology Letters, vol. 4, No. 10, Oct. 1992, J. M. Wiesenfeld, et al., "Cascadability and Fanout of Semiconductor Optical Amplifier Wavelength Shifter", pp. 1168–1171.

Electronics Letters, vol. 27, No. 23, Nov. 7, 1991, P. Pottier et al., "1.5 Gbit/s Transmission System Using All Optical Wavelength Converter Based on Tunable Two–Electrode DFB Laser", pp. 2183–2185.

IEEE Transactions Photonics Technology Letters, vol. 3, No. 12, Dec. 1991, M. Schilling, et al. "Multifunctional Photonic Switching Operation of 1500 NM Y–Coupled Cavity Laser (YCCL) with 28 Tuning Capability", pp. 1054–1057.

Kobayashi et al., "Single–Mode Operation of 500 Mbit/s Modulated A/GaAs Semiconductor laser by injection locking" *Electronics Letters*, vol. 16, No. 19, 11 Sep. 1980

Maylon et al. The application of injection locked semiconductor lasers for Optical Communications . . . , *Conference Communications Equipments*, Apr. 1982, pp. 285–290.

*Primary Examiner*—Leo Boudreau
*Assistant Examiner*—Bhavesh Mehta
*Attorney, Agent, or Firm*—Oblon, Spivak, McClelland, Maier & Neustadt, P.C.

[57] ABSTRACT

A process for a simultaneous optical modulation transposition on several wavelengths. Use is made of a semiconductor laser able to freely oscillate on several longitudinal modes, the semiconductor laser being able to lock on a wavelength of an incident optical beam. The modulation is transposed on the modes which are not at the wavelength of the incident optical beam. Such a process may find particular application in optical telecommunication systems.

6 Claims, 3 Drawing Sheets

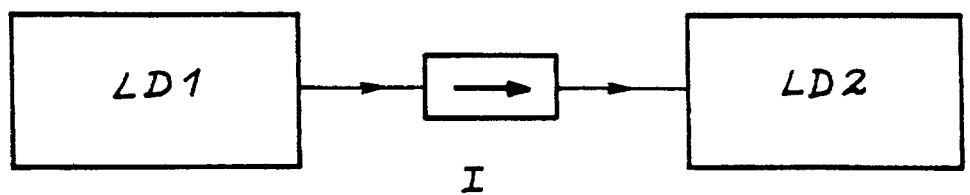
FIG. 1_a_
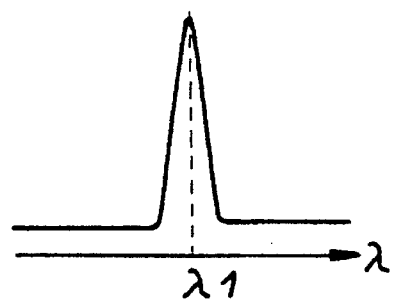
FIG. 1_b_
FIG. 1_c_
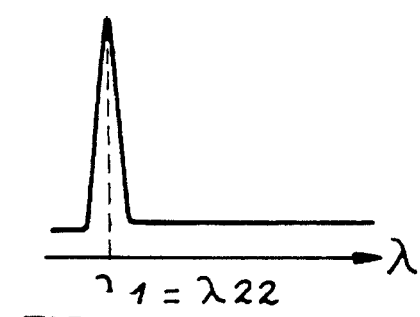
FIG. 1_d_
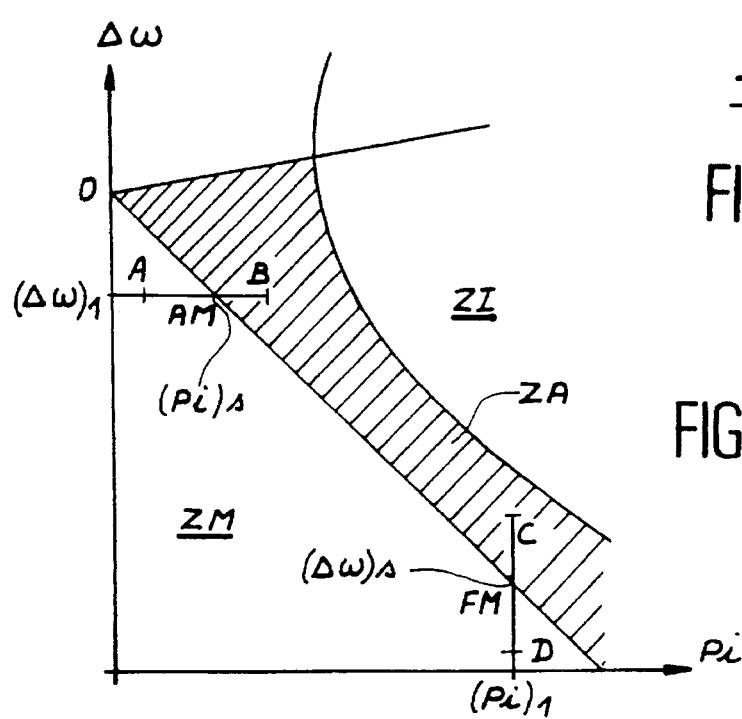
FIG. 2

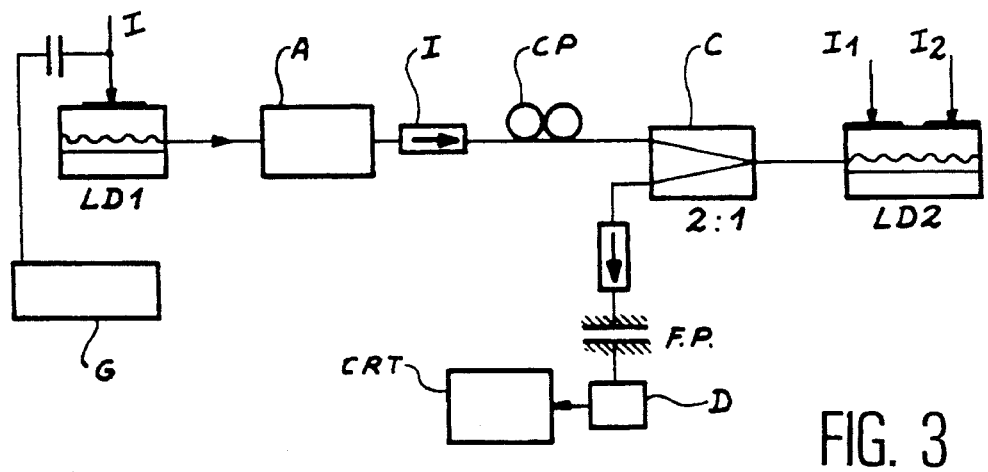
FIG. 3
FIG. 4_a_
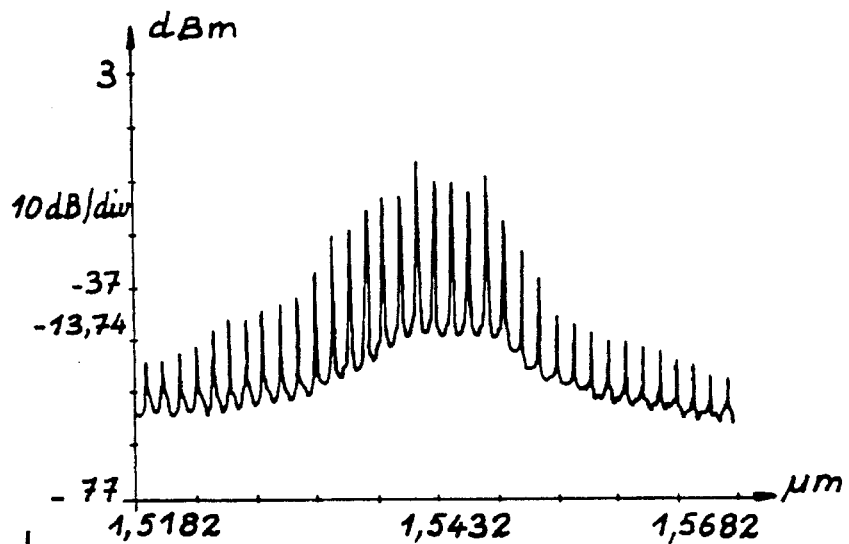
FIG. 4_b_
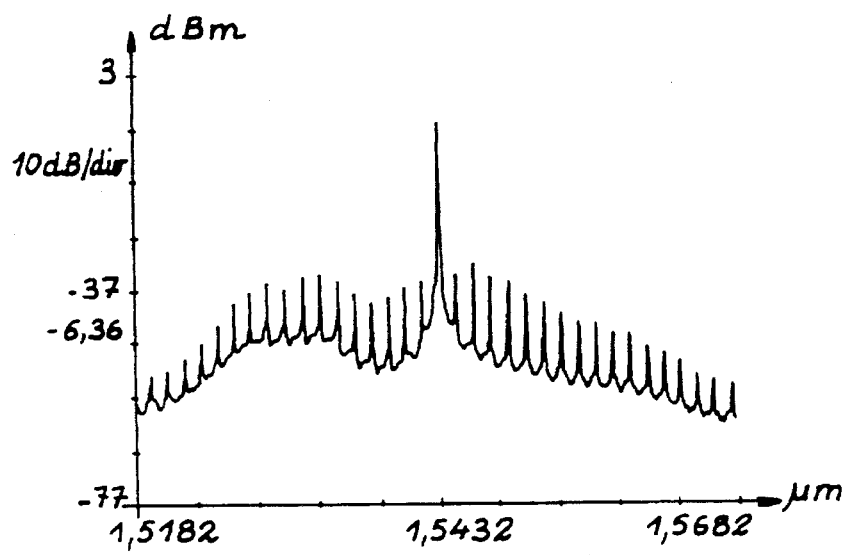

PROCESS FOR SIMULTANEOUS OPTICAL MODULATION TRANSPOSITION ON SEVERAL WAVELENGTHS

This application is a continuation of application Ser. No. 08/299,666, filed on Sep. 2, 1994, now abandoned.

DESCRIPTION

1. Technical Field

The present invention relates to a process for the simultaneous optical modulation transposition on several wavelengths. It is used in optical telecommunications.

2. Prior Art

The introduction of optics into telecommunications networks is due to the large transmission capacity offered by optical links. In order to take full advantage of this and obtain an optical transparency over the entire network, it is necessary to limit to the maxima the use of optical/electrical and electrical/optical connections. It is for this purpose that optical amplifiers (with doped fibers or semiconductors) have been developed. By ensuring an all-optical regeneration of the signals they make it possible to eliminate electrical repeaters.

In a telecommunications network using several wavelengths (a so-called multicolor network), the routing operation (called space-division switching of circuits or wavelength switching) implies basic functions fulfilled by wavelength-tunable transmitters, large capacity star couplers or tunable optical filters. To these functions must be added that of wavelength transposition consisting of transferring the information from one optical carrier to another. It not only makes it possible to switch an information in a network by "coloring" the signal, but also the connection between two local multi-color networks.

One possibility for obtaining this transposition consists of detecting the information received on a wavelength and using the resulting electrical signal for modulating a laser transmitting at another wavelength.

Such a device able to fulfill this function can be in two different forms:

in the first, the information is initially on a fixed wavelength $\lambda_0$ and is transposed to another wavelength $\lambda_i$ chosen from among n possible wavelengths, so that at the output of the device it is possible to successively access the information on any one of the wavelengths $\lambda_1, \lambda_2, \ldots \lambda_n$:

in the second, the information reaches the device on a wavelength $\lambda_i$ selected from among n possible wavelengths and the device transfers the signal to another fixed wavelength $\lambda_0$.

Hitherto, this transposition operation has been obtained with the aid of laser diodes and semiconductor amplifiers. In the first case action takes place on the transmission wavelength of a monomodal laser of the Distributed Feedback or DFB type or the Distributed Bragg Reflection or DBR type by optical injection in the active zone.

This is described in the two following articles:

P. POTTIER, M. J. CHAWKI, R. AUFFRET, G. CLAVEAU, A. TROMEUR "1.5 Gbit/s transmission system using all optical wavelength convertor based on tunable two-electrode DFB laser", Electron. Lett., vol. 27, pp. 2183–2184, 1991;

B. MIKKELSEN, T. DURHUUS, R. J. PEDERSEN, K. E. STUBKJAER, "Penalty free wavelength conversion of 2.5 Gbit/s signals using a tuneable DBR-laser", Proc. ECOC'92, Berlin, September 1992.

With regards to semiconductor amplifiers, they either use the gain saturation variation phenomenon, or four wave mixing in order to bring about the transposition.

This is described in the two following articles:

J. M. WIESENFELD, B. GLANCE, "Cascadability and fanout of semiconductor optical amplifier wavelength shifter", IEEE Photon. Technol. Lett., vol. 4, pp. 1168–1171, 1992;

G. GROSSKOPF, R. LUDWIG, H. G. WEBER, "140 Mbit/s DPSK transmission using an all-optical frequency convertor with a 4000 GHz conversion range", Electron. Lett., vol. 24, pp. 1106–1107, 1988.

No matter which procedure is adopted, the wavelength selection from which or to which the signal is transposed takes place sequentially and not in parallel, namely at a given instant a single wavelength is affected by the transposition phenomenon. Networks using these transposition mechanisms consequently lack flexibility.

SUMMARY OF THE INVENTION

The object of the present invention is to obviate the disadvantages in the conventional systems. To this end it proposes a process making it possible to simultaneously transpose the information on different wavelengths. Thus, by simply adjusting a tunable optical filter at the output of the transposition device, the transposed signal is selected on the desired wavelength. However, it is also possible to permit the passage of all the wavelengths and thus transmit the information to multiple receivers. These elements give the telecommunications network flexibility. Moreover, transposition takes place without changing the modulation format (the input and output signals both being amplitude-modulated) or with a change of format (the incident signal being frequency-modulated and the outgoing signal is amplitude-modulated).

According to the invention, these results are obtained by a process including:

using a semiconductor laser able to freely oscillate on several longitudinal modes, said laser being able to lock on an incident optical beam if the latter has an appropriate frequency detuning compared with one of its longitudinal modes and an appropriate optical power, injecting into said laser an optical beam carrying the modulated signal to be transposed, regulating the modulation and wavelength of said signal in such a way that, for one of the extreme states of the modulated signal, the laser is locked on the incident beam and only transmits on the sole longitudinal mode corresponding to the wavelength of the incident beam and, for another extreme state of the modulated signal, the laser is not locked on the incident beam and simultaneously oscillates on several longitudinal modes, using the beam transmitted by the laser, which comprises a plurality of longitudinal modes on which the modulation has been simultaneously transposed.

The transposition can be obtained no matter what the modulation type used on the incident beam, namely amplitude or frequency modulation. However, the outgoing beam is in all cases amplitude-modulated.

BRIEF DESCRIPTION OF THE DRAWINGS

FIG. 1 is a basic diagram of the locking of two lasers by optical injection.

FIG. 2 shows the connection range of a laser as a function of the frequency detuning between the wavelengths of the injected signal and the injected mode.

FIG. 3 illustrates an experimental circuit making it possible to use and test the process according to the invention.

FIG. 4 shows a transmission spectrum of a multimode laser in the absence of optical injection (a) and in the presence of optical injection (b).

DETAILED DESCRIPTION OF EMBODIMENTS

Figure 5:
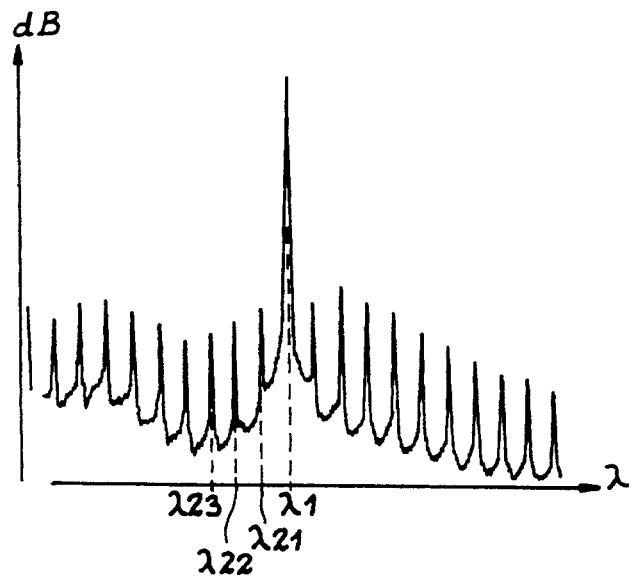
FIG. 5 shows an extension of a transmission spectrum of a laser.

The process according to the invention is based on the known locking procedure for semiconductor lasers by optical injection, but within the very special scope of lasers which oscillate or are able to oscillate on a plurality of longitudinal modes.

The injection locking phenomenon is already used in optical transmission systems, cf. P. DOUARE, "Optical Phase Modulation Behaviour of an Injection-Locked Semiconductor Laser for an Optical Transmission System", Opt. Commun., vol. 12, 2, pp. 64 68, 1991.

The physical principles involved are illustrated in FIGS. 1 and 2.

FIG. 1 shows in part a a first monomodal semiconductor laser LD1 emitting on a signal wavelength $\lambda_1$. The spectrum is diagrammatically represented on part b. A second laser LD2 operates in longitudinal multimode conditions. The spectrum of these modes is diagrammatically represented on part c. These modes are at wavelengths $\lambda_{21}$, $\lambda_{22}$, $\lambda_{23}$, etc., all separated by the same amount c/2nL, if L is the length of the resonator used and n the refractive index of the semiconductor. In the absence of optical injection all these modes oscillate.

If the optical injection at the wavelength $\lambda_1$ coincides with a longitudinal mode (e.g. the mode at wavelength $\lambda_{22}$ as in part d), this mode will be privileged and the laser will lock on the wavelength $\lambda_1 = \lambda_{22}$, all the other modes being "extinguished".

In order to make the laser LD2 emit solely on a wavelength $\lambda_{2i}$, a double condition must be fulfilled on the injected power Pi and on the frequency detuning $\Delta\omega = 2\pi c(1/\lambda_1 - 1/\lambda_{2i})$, in which $\lambda_{2i}$ is the wavelength of one of the modes of LD2. This double condition defines a connection zone within which the locking of the two lasers occurs. This is shown in FIG. 2, where the power Pi is plotted on the abscissa and the detuning $\Delta\omega$ on the ordinate. The connection zone is the hatched zone ZA. An instability zone is designated ZI and a modulation zone ZM.

In amplitude modulation, the operation will be as follows. The frequency detuning compared with one of the modes of the laser LD2 is fixed and has the value $(\Delta\omega)1$. For this detuning, there is a power threshold (Pi)s beyond which the connection zone ZA occurs and on this side of which one is outside the zone and more specifically in the modulation zone ZM. The amplitude modulation of the injected incident beam is therefore regulated so that the operating point passes alternately from the marked point A (outside the connection zone) to the marked point B (within the connection zone). Therefore, the laser will alternately oscillate on all the the modes when the operating point is at A, or only on the mode locked on the wavelength $\lambda_1$ when the operating point is at B, the others being extinguished.

All the modes at wavelengths differing from $\lambda_1$ will therefore alternately oscillate and be extinguished. They are therefore amplitude-modulated. Therefore the amplitude modulation has been simultaneously transposed on all the modes other than that at the wavelength $\lambda_1$.

Thus, the modulation obtained on all these modes is complementary of the incident modulation because, when the incident signal is at high level (point B) the modes are extinguished, therefore at low level and vice versa. The mode locked at $\lambda_1$ directly reproduces the incident modulation.

A similar mechanism develops for a frequency-modulated incident signal. In this case, the power is constant, namely (Pi)1 and it is the frequency shift which varies. There is a threshold $(\Delta\omega)s$ beyond which there is a connection of the laser LD2 to the incident beam (marked point C) and on this side of which the connection is impossible (marked point D). Thus, here again, there are modes which are alternately extinguished by connection to $\lambda_1$ (point C) or oscillate (point D). Therefore transposition takes place simultaneously on a plurality of modes.

Thus, according to the invention, the modulation format is or is not modified, an amplitude or frequency modulation on the incident signal being transposed into an amplitude modulation.

FIG. 3 illustrates an experimental circuit making it possible to test the process according to the invention and which comprises a laser diode LD1 of the monoelectrode DFB laser type and whose supply current is modulated around I=30 mA by a generator G. The beam emitted is at the wavelength $\lambda_1$=1542.2 nm. The optical signal then traverses an optical amplifier A and then an insulator I and propagates in an optical fiber and then in a polarization controller CP making it possible to adjust the polarization plane of the injected light in such a way as to make it transverse electric. The light is then injected into the active zone of a bielectrode DFB laser diode LD2, whose spectrum is multimodal. In view of the correspondence between the wavelength $\lambda_1$ of the source and one of the resonance peaks of the laser LD2, the latter is synchronized on the laser LD1.

The light from the converter laser LD2 is recovered by the same front face which made the injection possible and is directed across the type 2:1 coupler C to a Fabry-Perot filter FP 1. The filter, which has a definition of 100 and a full width half maximum of 3.3 nm (43 GHz), then selects one of the wavelengths on which the information has been transposed. The signal obtained is detected with the aid of a PIN photodiode-type detector D. The detected signal is observed on a CRT oscilloscope screen. This circuit makes it possible to carry out two types of study, one being static and the other dynamic.

a) Static Study

The effect of locking by optical injection on the emission of the multimode laser LD2 is illustrated by the two spectra of FIG. 4. In the absence of injected light and when the supply currents of the laser LD2 are respectively $I_1$=47.5 mA and $I_2$=52.6 mA, the laser LD2 emits on about ten modes spaced from one another by 1.43 um (FIG. 4a). For each of them there is an optical power of approximately −10 dBm at the output of the laser, namely 100 μW.

However, on injecting light into the laser LD2 at wavelength $I_1$=1543.2 nm, which coincides with the wavelength of one of the self-oscillating modes of the cavity, the laser LD2 becomes monomodal (FIG. 4b).

Thus, the modes which initially oscillated and which are located in a spectral band of about a dozen nanometres around the wavelength $\lambda_1$ are extinguished or greatly attenuated. The difference of the power emitted on each of these ten modes, between the spectra measured with and without injection, gives an extinction rate of 20 dB.

This result was obtained for a constant optical power at the input of the injection system of approximately 500 μW. An anti-reflection treatment of the face of the laser by which the incident beam is injected would make it possible to reduce the insertion losses and therefore reduce this power. Moreover, the phenomenon is also observed for modes which are spectrally more remote. However, for the latter the self-oscillation is weaker, so that the optical injection locking effect is less.

b) Dynamic Study

Figure 6:
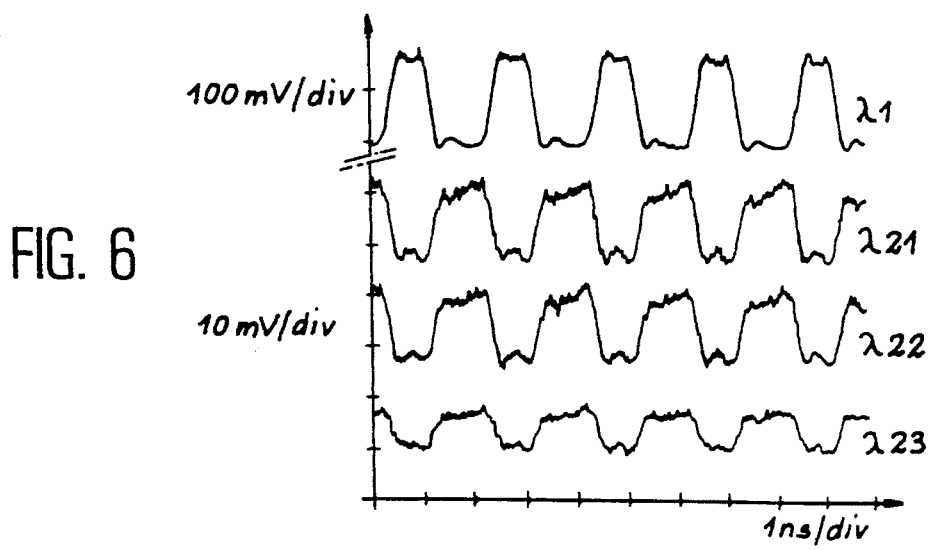
FIG. 6 shows various modulated signals supplied by the laser on several wavelengths and resulting from the transposition phenomenon.

The optical signal injected into the laser LD2 is amplitude-modulated at 500 MHz and its wavelength is still $\lambda_1$=1543.2 nm (FIG. 5). There is an information transposition on the other modes of the cavity LD2 in FIG. 6. In FIG. 6, the three bottom lines represent the signals transposed on three of these modes ($\lambda_{21}$=1541.8 nm; $\lambda_{22}$=1540.3 nm; $\lambda_{23}$=1538.9 nm). The wavelength conversion was detected in all on eight modes, therefore on a range of 12 nm on either side of the wavelength $\lambda_1$. Moreover, recovery takes place on the wavelength $\lambda_1$ of the same signal as the source signal (FIG. 6, top line), whereas on the wavelengths $\lambda_{21}$, $\lambda_{22}$ and $\lambda_{23}$, the complemented signal is obtained.

Figure 7:
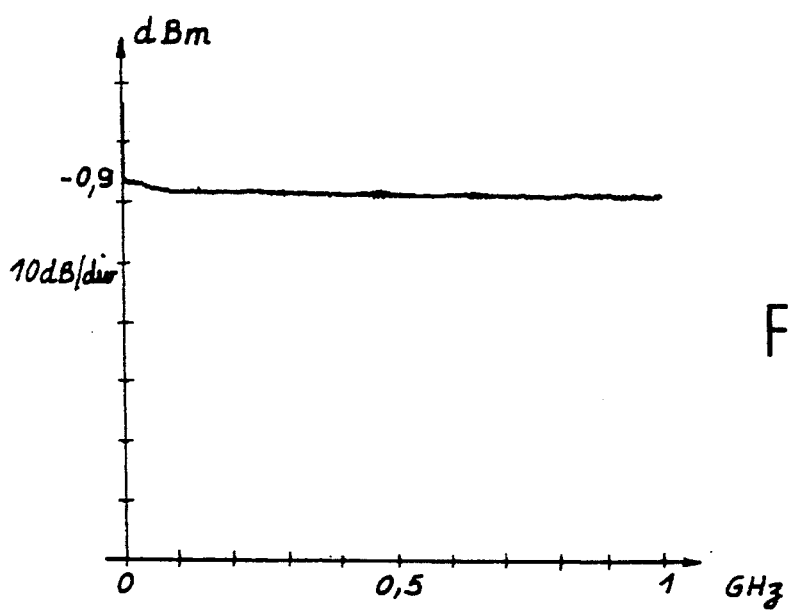
FIG. 7 shows the amplitude modulation response for a transposed signal.

The frequency response of the transposition phenomenon remains flat up to 1GHz, as is apparent from FIG. 7, where the frequency is plotted on the abscissa.

On the basis of the above description, it is clear that the process according to the invention makes it possible to transpose an information at high speed of one wavelength to several other wavelengths and in a simultaneous manner. Moreover, the use of the optical injection locking phenomenon makes it possible to obtain a high contrast of the transposed signals, because the static study has revealed an extinction rate for the approximately ten self-oscillating modes of the converter laser of more than 20 dB during the injection of 500 μW. Finally, although in the described experiment the laser used had ten self-oscillating modes, there is nothing to prevent the use of lasers containing more than ten modes (provided that use is made of a detector with high amplification and sensitivity). This increases by the same amount the number of wavelengths to which the transposition can be performed.

We claim:

1. A system for the wavelength transposition of a modulated optical signal, comprising:

a first semiconductor laser for generating an incident modulated optical beam to be transposed;

a single second semiconductor laser for receiving the incident optical beam and being able to freely oscillate on several longitudinal modes, said single second semiconductor laser being able to lock on a wavelength of the incident optical beam based on if the incident optical beam has a frequency detuning of one of the longitudinal modes of the single second semiconductor laser and if the incident optical beam has an optical power which exceeds a predetermined threshold;

wherein a wavelength of a signal output of the single second semiconductor laser is regulated and modulated such that, for a first state of the incident optical beam, the single second semiconductor laser is locked on the wavelength of the incident optical beam and only transmits on the longitudinal mode corresponding to the wavelength of the incident optical beam and, for a second state of the incident optical beam, the single second semiconductor laser is not locked on the wavelength of the incident optical beam and simultaneously oscillates on the several longitudinal modes.

2. The system according to claim 1, wherein the incident optical beam is amplitude-modulated and has a predetermined wavelength equal to a wavelength of one of the longitudinal modes of the single second semiconductor laser, the power of the incident optical beam being modulated between a first value exceeding a threshold power beyond which the single second semiconductor laser is locked on the wavelength of the incident optical beam and below which the single second semiconductor laser is not locked and oscillates freely, and a second value below said threshold.

3. The system according to claim 1, wherein the incident optical beam is frequency-modulated and has a constant power, the frequency of the incident optical beam being modulated between a first value exceeding a threshold value beyond which the single second semiconductor laser is locked on the wavelength of the incident optical beam and below which the single second semiconductor laser is not locked and oscillates freely, and a second value below said threshold value.

4. A process for the wavelength transposition of a modulated optical signal, comprising the steps of:

generating an incident modulated optical beam to be transposed;

inputting the incident optical beam into a single semiconductor laser able to freely oscillate on several longitudinal modes, said single semiconductor laser being able to lock on a wavelength of the incident optical beam based on if the incident optical beam has a frequency detuning of one of the longitudinal modes of the single semiconductor laser and if the incident optical beam has an optical power which exceeds a predetermined threshold;

wherein a wavelength of a signal output of the single semiconductor laser is regulated and modulated such that, for a first state of the incident optical beam, the single semiconductor laser is locked on the wavelength of the incident optical beam and only transmits on the longitudinal mode corresponding to the wavelength of the incident optical beam and, for a second state of the incident optical beam, the single semiconductor laser is not locked on the wavelength of the incident optical beam and simultaneously oscillates on the several longitudinal modes.

5. The process according to claim 4, wherein the incident optical beam is amplitude-modulated and has a predetermined wavelength equal to a wavelength of one of the longitudinal modes of the single semiconductor laser, the power of the incident optical beam being modulated between a first value exceeding a threshold power beyond which the single semiconductor laser is locked on the wavelength of the incident optical beam and below which the single semiconductor laser is not locked and oscillates freely, and a second value below said threshold.

6. The process according to claim 4, wherein the incident optical beam is frequency-modulated and has a constant power, the frequency of the incident optical beam being modulated between a first value exceeding a threshold value beyond which the single semiconductor laser is locked on the wavelength of the incident optical beam and below which the single semiconductor laser is not locked and oscillates freely, and a second value below said threshold value.

* * * * *

UNITED STATES PATENT AND TRADEMARK OFFICE
CERTIFICATE OF CORRECTION

PATENT NO. : 5,555,121
DATED : September 10, 1996
INVENTOR(S) : Herve DUPONT, et al.

It is certified that error appears in the above-indentified patent and that said Letters Patent is hereby corrected as shown below:

On the title page, Item [73], the Assignee, should read:

--[73] Assignee: France Telecom Etablissement autonome de droit public, Paris, France--

Signed and Sealed this

Twenty-fourth Day of December, 1996

Attest:

BRUCE LEHMAN

*Attesting Officer*   *Commissioner of Patents and Trademarks*